(12) United States Patent
Chen et al.

(10) Patent No.: US 12,495,505 B2
(45) Date of Patent: Dec. 9, 2025

(54) PRINTED CIRCUIT BOARD FOR PHASED ARRAY ANTENNA TRANSCEIVER ASSEMBLY, TRANSCEIVER ASSEMBLY AND RADAR

(71) Applicant: SHENNAN CIRCUITS CO.,LTD., Shenzhen (CN)

(72) Inventors: Li Chen, Shenzhen (CN); Shuping Shan, Shenzhen (CN); Guodong Guo, Shenzhen (CN)

(73) Assignee: SHENNAN CIRCUITS CO., LTD., Shenzhen (CN)

( * ) Notice: Subject to any disclaimer, the term of this patent is extended or adjusted under 35 U.S.C. 154(b) by 212 days.

(21) Appl. No.: 18/433,761

(22) Filed: Feb. 6, 2024

(65) Prior Publication Data

US 2024/0179852 A1 May 30, 2024

Related U.S. Application Data

(63) Continuation of application No. PCT/CN2021/142194, filed on Dec. 28, 2021.

(30) Foreign Application Priority Data

Sep. 1, 2021 (CN) .......................... 202111022007.X

(51) Int. Cl.
*H05K 3/46* (2006.01)
*G01S 13/02* (2006.01)
(Continued)

(52) U.S. Cl.
CPC ............ *H05K 3/4602* (2013.01); *G01S 13/02* (2013.01); *H05K 1/0209* (2013.01);
(Continued)

(58) Field of Classification Search
CPC .. H05K 3/4602; H05K 1/0209; H05K 3/1258; H05K 1/0206; H05K 3/4697; H05K 2201/09036; H05K 2201/10416
See application file for complete search history.

(56) References Cited

U.S. PATENT DOCUMENTS 4,730,232 A 3/1988 Lindberg et al.
5,287,247 A * 2/1994 Smits ...................... H01L 23/36
257/E23.101
(Continued)

FOREIGN PATENT DOCUMENTS

CN 106102350 A 11/2016
CN 106229678 A 12/2016
(Continued)

OTHER PUBLICATIONS

European Search Report, European Application No. 21955843.4, mailed Nov. 22, 2024 (8 pages).
(Continued)

*Primary Examiner* — Sherman Ng

(57) ABSTRACT

A printed circuit board (PCB) for a phased array antenna transceiver assembly, a transceiver assembly, and a radar are provided. The PCB includes a microwave core board layer, operating in a first frequency band, where a chip carrying area is arranged on a side of the microwave core board layer, and the chip carrying area is configured to carry a chip; a digital core board layer, operating in a second frequency band and stacked on another side of the microwave core board layer away from the chip carrying area; where an interlayer connecting path is arranged on the microwave core board layer and the digital core board layer, and the interlayer connecting path is connected to the chip carrying area; and a heat dissipation member, embedded in the digital core board layer and connected to the chip carrying area.

20 Claims, 3 Drawing Sheets

(51) Int. Cl.
*H05K 1/02* (2006.01)
*H05K 3/00* (2006.01)
*H05K 3/12* (2006.01)

(52) U.S. Cl.
CPC ......... *H05K 3/0088* (2013.01); *H05K 3/1258* (2013.01); *G01S 2013/0245* (2013.01); *H05K 2201/10098* (2013.01)

(56) References Cited

U.S. PATENT DOCUMENTS

| | | | | |
|---|---|---|---|---|
| 10,433,413 | B2* | 10/2019 | Yu | ........................ H05K 3/4644 |
| 2003/0100197 | A1* | 5/2003 | Veitschegger | ......... H05K 3/429 |
| | | | | 439/55 |
| 2010/0141350 | A1 | 6/2010 | Sasaki et al. | |
| 2010/0238635 | A1 | 9/2010 | Yang et al. | |
| 2018/0351262 | A1 | 12/2018 | Yoon et al. | |

FOREIGN PATENT DOCUMENTS

| | | | |
|---|---|---|---|
| CN | 108987942 | A | 12/2018 |
| CN | 109980365 | A | 7/2019 |
| WO | 2016053501 | A1 | 4/2016 |
| WO | 2021004459 | A1 | 1/2021 |

OTHER PUBLICATIONS

International Search Report, International Application No. PCT/CN2021/142194, mailed May 30, 2022 (13 pages).

* cited by examiner

PRINTED CIRCUIT BOARD FOR PHASED ARRAY ANTENNA TRANSCEIVER ASSEMBLY, TRANSCEIVER ASSEMBLY AND RADAR

CROSS REFERENCE TO RELATED APPLICATIONS

The present disclosure is a continuation of International Patent Application No. PCT/CN2021/142194, filed Dec. 18, 2021, which claims the priority to Chinese Patent Application No. 202111022007.X, filed Sep. 1, 2021, both of which are herein incorporated by reference in their entireties.

TECHNICAL FIELD

The present disclosure relates to the field of antenna arrays, and in particular to a printed circuit board for a phased array antenna transceiver assembly, a transceiver assembly, and a radar.

BACKGROUND

In recent years, with the continuous development of science and technology, a phased array radar technology has become a mainstream technology of radar.

Currently, the radar generally includes several transmitter and receiver (TR) assemblies and several antenna units connected to the TR assemblies, and each of the antenna units corresponds to one of the TR assemblies. Each of the TR assemblies generally includes a digital part and a microwave part. The digital part and the microwave part are directly assembled in a physical manner, resulting in a large volume and a poor heat dissipation. At the same time, a volume occupied by the several TR assemblies is also large, resulting in a large volume of the whole radar.

SUMMARY OF THE DISCLOSURE

According to a first aspect of the embodiments of the present disclosure, a printed circuit board for a phased array antenna transceiver assembly is provided. The printed circuit board includes: a microwave core board layer, operating in a first frequency band, where a chip carrying area is arranged on a side of the microwave core board layer, and the chip carrying area is configured to carry a chip; a digital core board layer, operating in a second frequency band and stacked on another side of the microwave core board layer away from the chip carrying area; where an interlayer connecting path is arranged on the microwave core board layer and the digital core board layer, and the interlayer connecting path is connected to the chip carrying area; and a heat dissipation member, embedded in the digital core board layer and connected to the chip carrying area.

According to a second aspect of the embodiments of the present disclosure, a transceiver assembly is provided. The transceiver assembly is configured to be connected to one or more antenna units and includes: the printed circuit board as described in the first aspect; and at least one chip, disposed on the chip carrying area and corresponding to the chip carrying area in a one-to-one manner; where the interlayer connecting path is configured to connect the chip disposed on the chip carrying area.

According to a third aspect of the embodiments of the present disclosure, a radar is provided. The radar includes: several antenna units, configured to transmit and receive signals; and the transceiver assembly as described in the second aspect, connected to the several antenna units, and configured to receive or output the signals.

BRIEF DESCRIPTION OF THE DRAWINGS

FIG. 1b is a structural schematic view of a chip carried on the printed circuit board as shown in FIG. 1a.

FIG. 2b is a structural schematic view of a chip carried on the printed circuit board as shown in FIG. 2a.

DETAILED DESCRIPTION

Figure 1A:
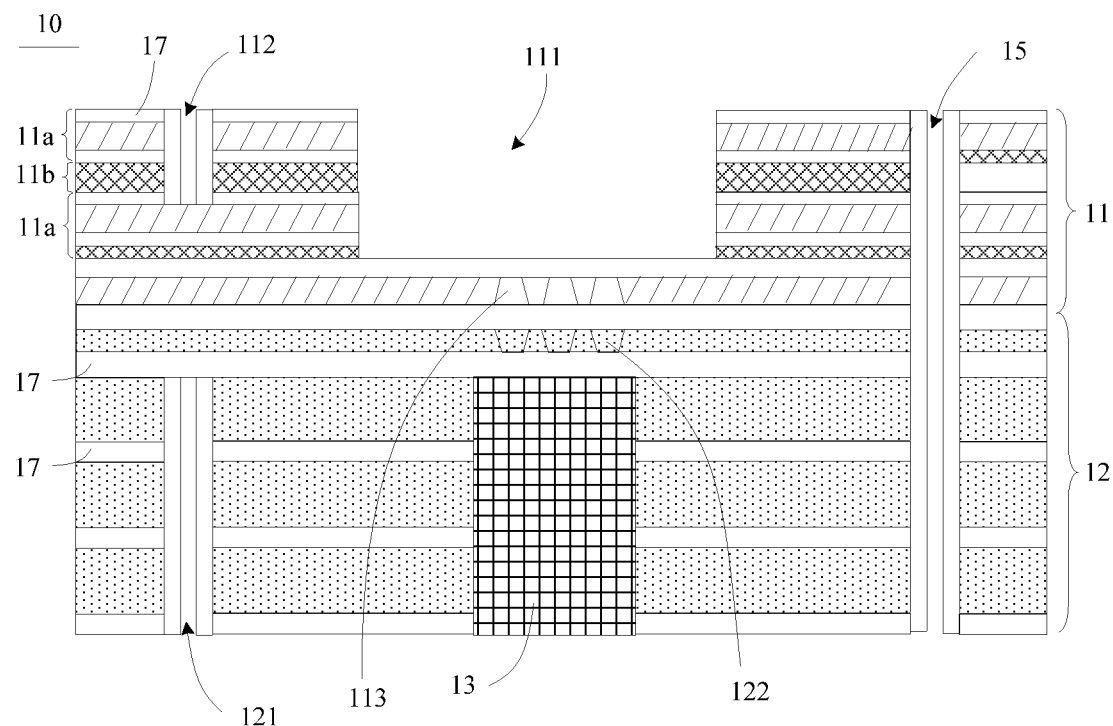
FIG. 1a is a structural schematic view of a printed circuit board according to an embodiment of the present disclosure.

Technical solutions in the embodiments of the present disclosure will be clearly and completely described below by referring to the accompanying drawings in the embodiments of the present disclosure. Obviously, the described embodiments are only some of but not all of the embodiments of the present disclosure. Based on the embodiments in the present disclosure, all other embodiments obtained by any ordinary skilled person in the art without making creative work shall fall within the scope of the present disclosure.

Terms "first", "second" and "third" herein are used for descriptive purposes only and shall not be interpreted as indicating or implying relative importance or implicitly specifying the number of indicated technical features. Therefore, a feature defined by the "first", "second", or "third" may explicitly or implicitly include at least one such feature. In the description of the present disclosure, "a plurality of" means at least two, such as two, three, and so on, unless otherwise expressly and specifically limited. All directional indications in the present disclosure (such as up, down, left, right, front, rear, . . . ) are used only to explain relative position relationship, movement, and the like, between components at a particular posture (as shown in the drawings). When the posture is changed, the directional indications may change accordingly. In addition, terms "include" and "have", and any variations thereof are intended to cover non-exclusive inclusion. For example, a process, a method, a system, a product or an apparatus including a series of operations or units is not limited to the listed operations or units, but may further include operations or units that are not listed, or include other operations or units that are inherent to the process, the method, the product or the apparatus.

Term "embodiment" of the present disclosure may indicate that a particular feature, a structure or a property described in an embodiment may be included in at least one embodiment of the present disclosure. Presence of the term in various sections in the specification does not necessarily mean a same embodiment or a separate or an alternative embodiment that is mutually exclusive with other embodiments. It shall be understood, both explicitly and implicitly, by any ordinary skilled person in the art that the embodiment described herein may be combined with other embodiments.

The present disclosure will be described in detail below by referring to the accompanying drawings and embodiments.

Figure 1B:
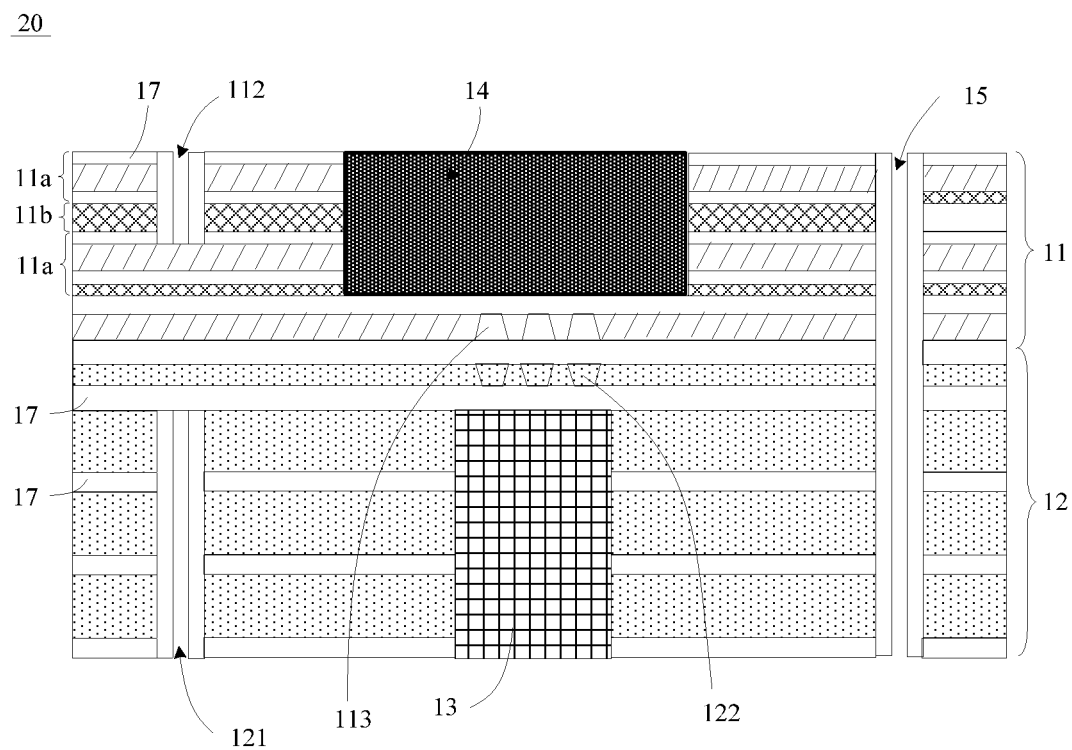

As shown in FIG. 1 and FIG. 1b, FIG. 1a is a structural schematic view of a printed circuit board according to an embodiment of the present disclosure, and FIG. 1b is a structural schematic view of a chip arranged on the printed circuit board as shown in FIG. 1a. In the embodiment, a printed circuit board 10 for a phased array antenna transceiver assembly is provided. A microwave circuit, a digital circuit, and a heat dissipation medium are integrated on a same circuit board by the printed circuit board 10, such that there is a high integration, a small volume, and a good heat dissipation effect.

As shown in FIG. 1a, the printed circuit board 10 includes a microwave core board layer 11, a digital core board layer 12, and a heat dissipation member 13.

In some embodiments, the microwave core board layer 11 includes a plurality of first sub core board layers 11a arranged in a stacking manner and a first dielectric layer 11b bonding with two adjacent layers of the plurality of first sub core board layers 11a. The microwave core layer 11 operates in a first frequency band. The first frequency band may be a high frequency band, for example, the microwave core layer 11 operates in a frequency band in a range from 0.3 GHZ to 30 GHz. In some embodiments, a material of the microwave core layer 11 may be a low loss material such as polytetrafluoroethylene or hydrocarbon resin.

The microwave core board layer 11 has a first side and a second side. A chip carrying area is arranged on the first side of the microwave core board layer 11, and the chip carrying area is configured to carry a chip 14, so as to form a transceiver assembly 20. A structure of the chip 14 carried on the printed circuit board 10 may refer to FIG. 1b. In some embodiments, the microwave core board layer 11 may include a plurality of chip carrying areas, and each of the plurality of chip carrying areas may correspondingly carry one chip 14, so as to form the transceiver assembly 20 having at least one channel, and thus the transceiver assembly 20 is connected to one or more antenna units.

In an embodiment, as shown in FIG. 1a, a first groove 111 is defined on a side of the microwave core board layer 11 opposite to the digital core board layer 12. The first groove 111 is configured to serve as the chip carrying area.

Figure 2A:
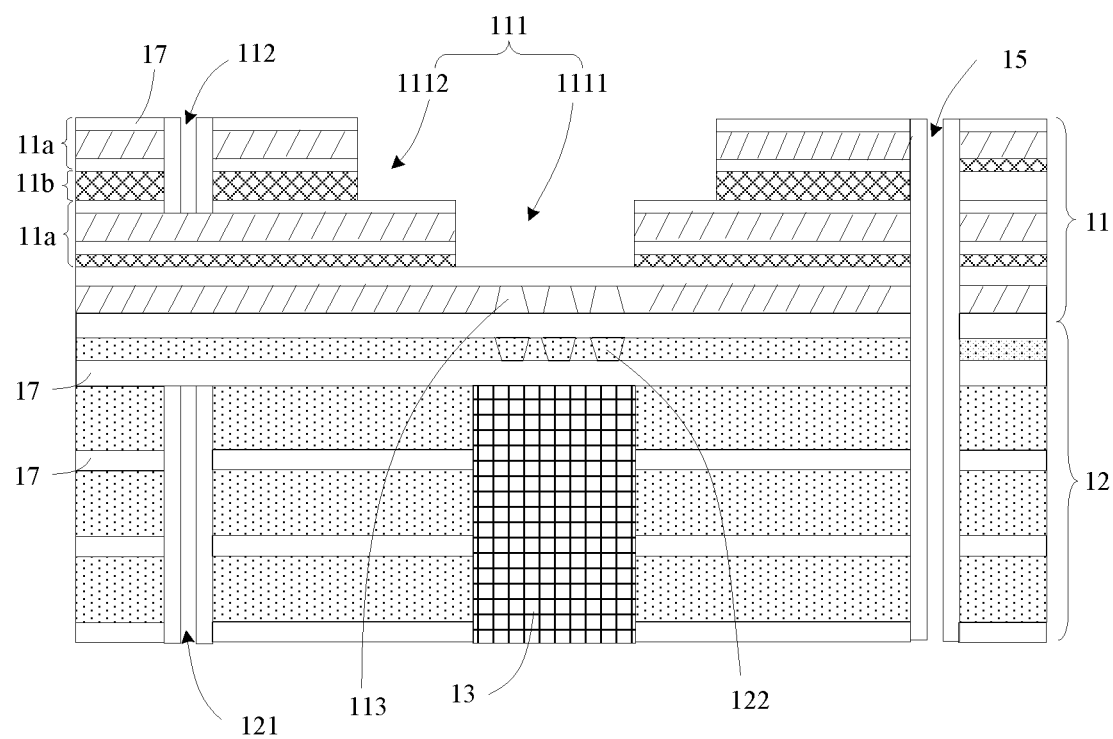
FIG. 2a is a structural schematic view of a printed circuit board according to another embodiment of the present disclosure.
Figure 2B:
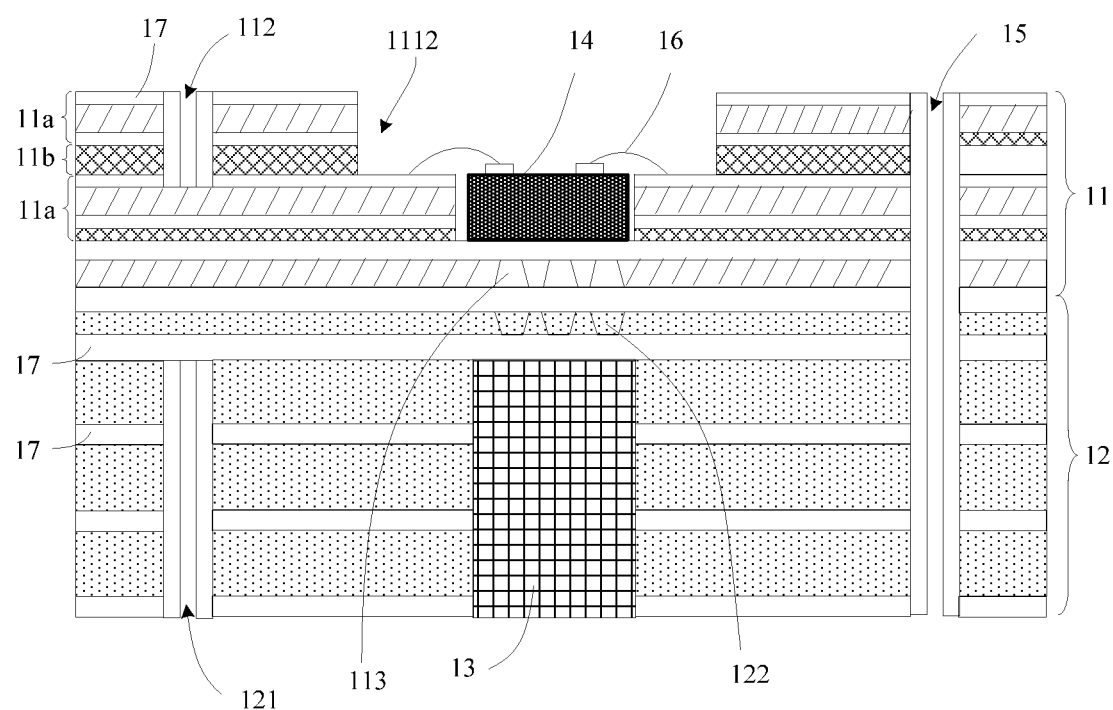

As shown in FIG. 2a and FIG. 2b, FIG. 2a is a structural schematic view of a printed circuit board according to another embodiment of the present disclosure, and FIG. 2b is a structural schematic view of a chip carried on the printed circuit board as shown in FIG. 2a. As shown in FIG. 2a, the first groove 111 may include a first groove body 1111 and a second groove body 1112.

In some embodiments, the first groove body 1111 is configured to accommodate the chip 14, and a specific structure of the chip 14 accommodated in the first groove body 1111 may refer to FIG. 2b. The first groove body 1111 is arranged as the chip carrying area, such that the chip 14 may be arranged inside the printed circuit board 10, and the prepared transceiver assembly 20 may not only realize a function of receiving or transmitting signals, but also realize a miniaturization of a product volume. In some embodiments, a size and/or a shape of the first groove body 1111 matches a size and/or a shape of the chip 14, so as to facilitate attaching the chip 14.

As shown in FIG. 2b, the second groove body 1112 is in communication with the first groove body 1111 and is disposed on a side of the first groove body 1111 away from the digital core layer 12. The second groove body 1112 is configured to accommodate a cable 16 electrically connected to the chip 14 and the microwave core layer 11. The cable 16 is connected to the chip 14 through a pad arranged on the chip 14. In the embodiment, by arranging the second groove body 1112, the cable 16 is disposed in the second groove body 1112, such that it may be possible to not only reduce a volume of the formed transceiver assembly 20, but also reduce a problem of a poor contact between the cable 16 and the chip 14 and/or the microwave core layer 11 caused by a contact between the cable 16 and other assembly outside the printed circuit board 10. In some embodiments, a radial size of the second groove body 1112 is greater than that of the first groove body 1111, so as to facilitate wiring and reduce the difficulty coefficient of processing.

The digital core board layer 12 includes a plurality of second sub core board layers arranged in a stacking manner and a second dielectric layer bonding with two adjacent layers of the plurality of second sub core board layers. In some embodiments, the digital core board layer 12 operates in a second frequency band. The second frequency band may be a low frequency band. For example, the digital chip layer 12 operates in a frequency band below 17 Hz. A material of the digital core board layer 12 may be epoxy resin.

In some embodiments, the digital core board layer 12 is stacked on another side of the microwave core board layer 11 away from the chip carrying area, that is, the digital core board layer 12 is stacked/disposed on the second side of the microwave core board layer 11. An interlayer connecting path is arranged on the microwave core board layer 11 and the digital core board layer 12, and the interlayer connecting path is configured to connect to the chip 14 disposed on the chip carrying area.

In some embodiments, as shown in FIG. 2b, a first guiding through hole 112 is defined on the microwave core board layer 11 along a stacking direction thereof, so as to communicate with at least two layers of the first sub core board layers 11a; and/or, a second guiding through hole 121 is defined on the digital core board layer 12 along a stacking direction thereof, so as to communicate with at least two layers of the second sub core board layers. In some embodiments, the printed circuit board 10 further includes a third guiding through hole 15. The third guiding through hole 15 penetrates an upper surface and a lower surface of the microwave core board layer 11 and an upper surface and a lower surface of the digital core board layer 12, so as to communicate with each of the first sub core board layers and each of the second sub core board layers. The first guiding through hole 112, the second guiding through hole 121 and the third guiding through hole 15 are configured to serve as the interlayer connecting path of the printed circuit board 10.

In some embodiments, the first guiding through hole 112, the second guiding through hole 121, and/or the third guiding through hole 15 are metal holes, that is, at least one of the first guiding through hole 112, the second guiding through hole 121, and the third guiding through hole 15 is a metal hole, such as copper-plated holes.

As shown in FIG. 1a to FIG. 2b, the heat dissipation member 13 is embedded in the digital chip layer 12 and connected to the chip carrying area, so as to dissipate the heat of the chip 14 carried on the chip carrying area. In some embodiments, the heat dissipation member 13 may be a metal block.

Figure 3:
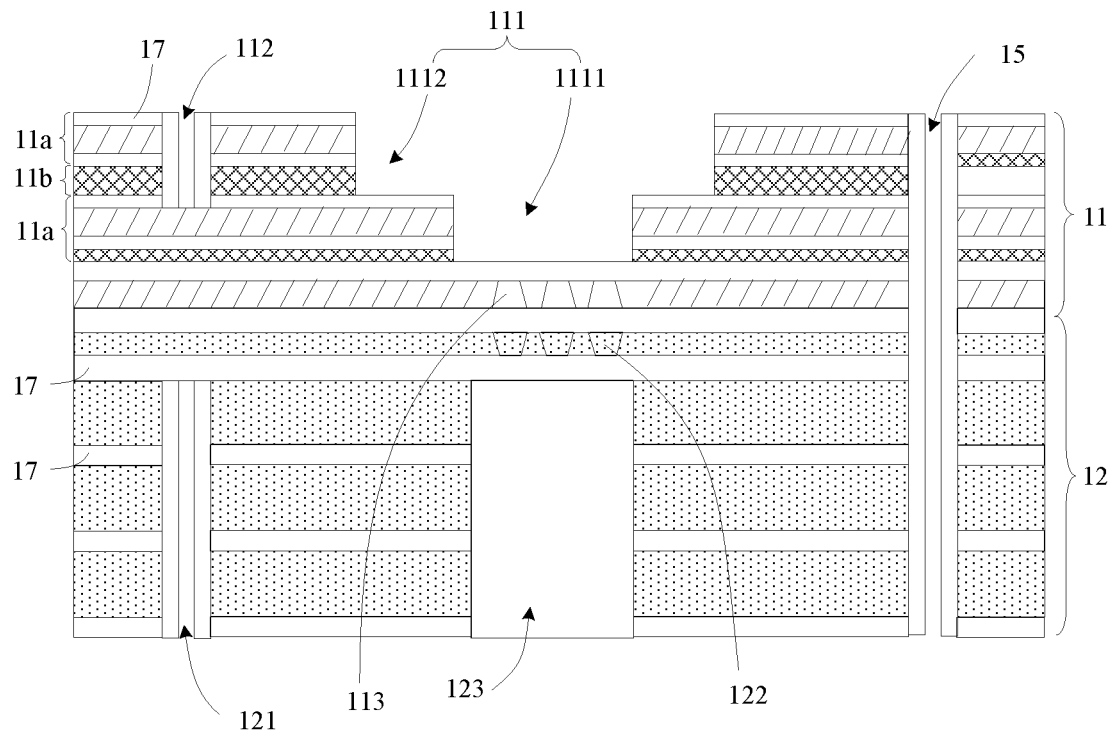
FIG. 3 is a structural schematic view of a printed circuit board without embedding a heat dissipation member according to an embodiment of the present disclosure.

In some embodiments, as shown in FIG. 2b and FIG. 3, FIG. 3 is a structural schematic view of the printed circuit board without embedding a heat dissipation member according to an embodiment of the present disclosure. A second groove 123 is defined on a side of the digital core board layer 12 opposite to the microwave core board layer 11, and corresponds to a position where the first groove 111 is defined. The heat dissipation member 13 is embedded in the second groove 123. The heat dissipation member 13 is arranged on a side of the chip 14 away from the pad of the chip 14, such that the heat of the chip 14 may be directly conducted outwards, thereby shortening a heat dissipation path and accelerating heat dissipation. At the same time, the heat dissipation member 13 is embedded in the digital core board layer 12, such that it may be possible to not only reduce the product volume of the printed circuit board 10, but also realize heat dissipation. In some embodiments, a side surface of the heat dissipation member 13 opposite to the microwave core board layer 11 may be approximately flush with a side surface of the digital core board layer 12 away from the microwave core board layer 11, so as to reduce a problem such as warping and bending of the printed circuit board 10.

In an embodiment, several first thermal conductive columns 113 are arranged on a side of the microwave core layer 11 facing the digital core layer 12. The several first thermal conductive columns 113 extend along a direction of the second side of the microwave core layer 11 facing the first side of the microwave core layer 11, and correspond to a bottom wall of the first groove 111. Besides, the several first thermal conductive columns 113 extend to the bottom wall of the first groove 111 or to a metal layer 17 where the bottom wall of the first groove 111 is disposed. In some embodiments, a radial size of the first thermal conductive column 113 may gradually decrease along the direction of the second side of the microwave core layer 11 facing the first side of the microwave core layer 11, so as to facilitate performing electrolytic hole filling.

In some embodiments, several first thermal conductive holes are defined on a side of the microwave core board layer 11 facing the digital core board layer 12, and a metal medium is arranged in each of the several first thermal conductive holes to form each of the several first thermal conductive columns 113 as mentioned above. In some embodiments, the several first thermal conductive holes extend along the direction of the second side of the microwave core layer 11 facing the first side, and the several first thermal conductive holes may be blind holes. In some embodiments, the metal medium may be formed in the first thermal conductive hole by mean of electrolytic hole filling.

Several second thermal conductive columns 122 are arranged on a side of the digital core board layer 12 facing the microwave core board layer. The several first thermally conductive columns 113 and the several second thermally conductive columns 122 are arranged in one-to-one correspondence. Heat of the chip 14 carried on the chip carrying area is transferred to the heat dissipation member through the several first thermally conductive columns 113 and the several second thermally conductive columns 122, so as to dissipate heat.

In some embodiments, several second thermal conductive holes are arranged on a side of the digital core layer 12 facing the microwave core layer 11, and a metal medium is arranged in each of the several second thermal conductive holes to form each of the several second thermal conductive columns 122. In some embodiments, the several second thermal conductive holes extend along a direction from a side of the digital core layer 12 facing the microwave core layer 11 to a side of the digital core layer 12 away from the microwave core layer 11. The several second thermal conductive holes may also be blind holes. In the embodiment, since the digital core board layer 12 may be further pressure-bonded to the microwave core board layer 11 after the metal medium is filled in the several second thermal conductive holes, the metal medium may be filled in the second thermal conductive hole by means of hole filling, so as to form the several second heat conduction columns 122. In this way, it may be possible to not only ensure a fullness of the metal medium in the second thermal conductive holes in a pressure-bonded manner, so as to ensure that the metal medium fills the entire second thermal conductive hole, but also reduce the difficulty coefficient of processing.

In the printed circuit board 10 for the phased array antenna transceiver assembly 20 provided by some embodiments of the present disclosure, by arranging the microwave core board 11, the microwave core board 11 operates in the first frequency band, and the chip carrying area is arranged on the side of the microwave core board 11, so as to carry the chip 14 through the chip carrying area. At the same time, by arranging the digital core board layer 12, the digital core board layer 12 operates in the second frequency band, and is stacked on the another side of the microwave core board layer 11 away from the chip carrying area. The interlayer connecting path is arranged on the microwave core board layer 11 and the digital core board layer 12, and is connected to the chip carrying area. Compared with a technical solution of directly assembling and connecting the microwave core board layer 11 and the digital core board layer 12 in a physical manner, the microwave core board layer 11 and the digital core board layer 12 are integrated on the same circuit board, and the microwave core board layer 11 is connected to the digital core board layer 12 through the interlayer connecting path, such that there is a high product integration, thereby effectively reducing the product volume. In addition, by arranging the heat dissipation member 13, the heat dissipation member 13 is embedded in the digital core board layer 12 and connected to the chip carrying area, such that the product volume may be further reduced, and the product has good heat dissipation.

As further shown in FIG. 1b or FIG. 2b, a transceiver assembly 20 is provided by some embodiments of the present disclosure. The transceiver assembly 20 includes a printed circuit board 10 and at least one chip 14.

In some embodiments, the printed circuit board 10 may be one provided in any one of the above-mentioned embodiments. The at least one chip 14 is arranged on the printed circuit board 10 and corresponds to the chip carrying area of the printed circuit board 10 in a one-to-one manner. That is, one chip carrying area corresponds to one chip 14, so as to form the transceiver assembly 20 having at least one signal channel. In some embodiments, one signal channel may be connected to one or more antenna units.

In the transceiver assembly 20 provided by some embodiments of the present disclosure, by arranging the printed circuit board 10 provided by any one of the above-mentioned embodiments, the chip 14 is disposed on the chip carrying area of the printed circuit board 10, and the transceiver assembly 20 having the at least one signal channel is formed, such that the transceiver assembly 20 may be connected to the one or more antenna units, thereby receiving or outputting the signals transmitted and received by the one or more antenna units. In addition, compared with the plurality of transceiver assemblies connected to the plurality of antenna units in the related art, the transceiver assembly 20 integrates the microwave core board layer 11, the digital core board layer 12, and the chip 14 on the same circuit board, such that the plurality of existing transceiver assemblies may be integrated on the same circuit board, thereby effectively improving the integration of the transceiver assembly 20 and reducing the volume occupied by the transceiver assembly 20, and thus it may be possible to reduce the volume of a radar including several transceiver assemblies 20.

Figure 4:
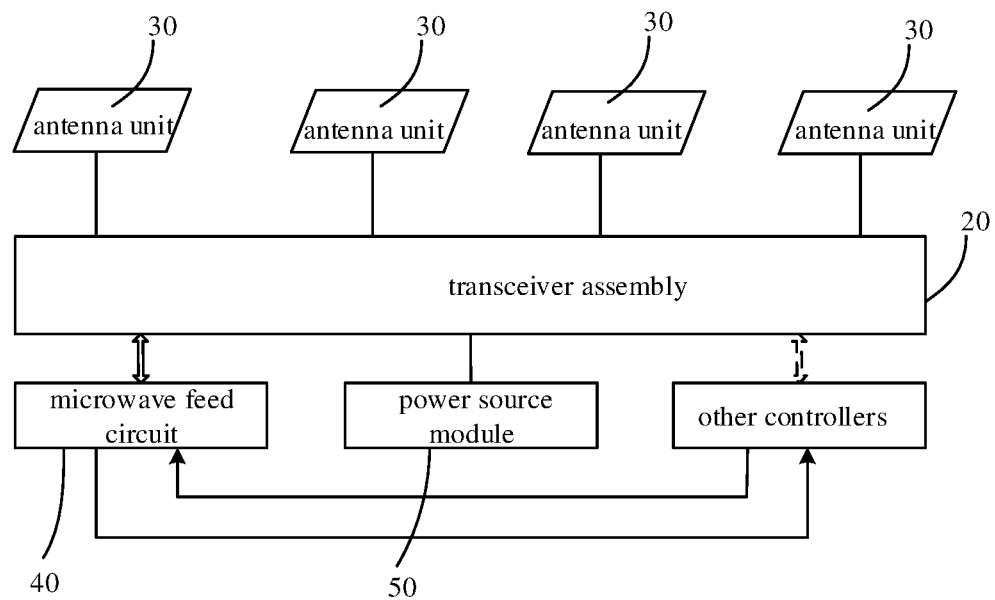
FIG. 4 is a schematic view of a connecting relationship between an antenna unit and a transceiver assembly according to an embodiment of the present disclosure.

In an embodiment, as shown in FIG. 4, FIG. 4 is a schematic view of a connecting relationship between an antenna unit and a transceiver assembly according to an embodiment of the present disclosure. A radar is provided by some embodiments of the present disclosure. The radar includes a transceiver assembly 20 and several antenna units 30.

In some embodiments, the several antenna units are connected to the transceiver assembly 20, and configured to transmit and receive signals. The transceiver assembly 20 may be one described in the above-mentioned embodiments, and may be configured to receive or output the signals transmitted and received by the several antenna units 30.

In some embodiments, the radar further includes a microwave feed circuit 40, a power source module 50, and other controllers. A working principle of the radar is as follows: (1) receiving signals: the several antenna units 30 receive electromagnetic wave signals and transmit the electromagnetic wave signals to the transceiver assembly 20, the transceiver assembly 20 outputs microwave feed signals after performing signal processing, the other controller members are configured to further process the microwave feed signals and convert the microwave feed signals to a user interface, and at the same time, the power source module 50 is configured to supply power for the above processing process; (2) transmitting signals: contrary to the above-mentioned process of receiving signals, control information of the user interface is output to the microwave feed circuit 40 through the other controllers, and the feed circuit transmits the signals to the transceiver assembly 20 for processing and then transfers the signals to the antenna unit 30 for radiation.

In some embodiments, the number of chips 14 is at least one, and the at least one chip 14 is connected to the one or more antenna units 30 in one-to-one correspondence.

In the radar provided by some embodiments of the present disclosure, by arranging the several antenna units 30 and the transceiver assembly 20, the signals may be transmitted through the several antenna units 30. In the transceiver assembly 20, the printed circuit board 10 is provided by any one of the above-mentioned embodiments, and the chip 14 is disposed on the chip carrying area of the printed circuit board 10, so as to form the transceiver assembly 20 with the at least one signal channel. In this way, the transceiver assembly 20 may be connected to the one or more antenna units, thereby receiving or outputting the signals transmitted and received by the one or more antenna units. In addition, compared with the plurality of transceiver assemblies connected to the plurality of antenna units in the related art, the transceiver assembly 20 integrates the microwave core board layer 11, the digital core board layer 12, and the chip 14 on the same circuit board, such that the plurality of existing transceiver assemblies may be integrated on the same circuit board, thereby effectively improving the integration of the transceiver assembly 20 and reducing the volume occupied by the transceiver assembly 20, and thus it may be possible to reduce the volume of a radar including several transceiver assemblies 20.

According to a first aspect of the embodiments of the present disclosure, a printed circuit board for a phased array antenna transceiver assembly is provided. The printed circuit board includes: a microwave core board layer, operating in a first frequency band, where a chip carrying area is arranged on a side of the microwave core board layer, and the chip carrying area is configured to carry a chip; a digital core board layer, operating in a second frequency band and stacked on another side of the microwave core board layer away from the chip carrying area; where an interlayer connecting path is arranged on the microwave core board layer and the digital core board layer, and the interlayer connecting path is connected to the chip carrying area; and a heat dissipation member, embedded in the digital core board layer and connected to the chip carrying area.

In some embodiments, a first groove is defined on the side of the microwave core board layer, and the first groove is configured to serve as the chip carrying area.

In some embodiments, a second groove is defined on a side of the digital core board layer opposite to the microwave core board layer and corresponds to a position where the first groove is defined, and the heat dissipation member is disposed in the second groove.

In some embodiments, a side surface of the heat dissipation member opposite to the microwave core board layer is flush with a side surface of the digital core board layer away from the microwave core board layer.

In some embodiments, several first thermally conductive columns are arranged on a side of the microwave core board layer facing the digital core board layer, and several second thermal conductive columns are arranged on a side of the digital core board layer facing the microwave core board layer; and the several first thermally conductive columns and the several second thermally conductive columns are arranged in one-to-one correspondence, and heat of the chip is transferred to the heat dissipation member through the several first thermally conductive columns and the several second thermally conductive columns.

In some embodiments, several first thermal conductive holes are defined on the side of the microwave core board layer facing the digital core board layer, and a metal medium is arranged in each of the several first thermal conductive holes to form each of the several first thermal conductive columns; and several second thermal conductive holes are defined on the side of the digital core board layer facing the microwave core board layer, and a metal medium is arranged in each of the several second thermal conductive holes to form in each of the several second thermal conductive columns.

In some embodiments, the microwave core board layer has a first side and a second side, the chip carrying area is arranged on the first side of the microwave core board layer, and the digital core board layer is stacked on the second side of the microwave core board layer.

In some embodiments, the several first thermal conductive holes extend along a direction of the second side of the microwave core layer facing the first side.

In some embodiments, a radial size of the first thermal conductive column gradually decreases along the direction of the second side of the microwave core layer facing the first side of the microwave core layer.

In some embodiments, the several first thermal conductive columns extend along a direction of the second side of the microwave core layer facing the first side of the microwave core layer, and correspond to a bottom wall of the first groove.

In some embodiments, the several second thermal conductive holes extend along a direction from a side of the digital core layer facing the microwave core layer to a side of the digital core layer away from the microwave core layer.

In some embodiments, each of the several first thermal conductive columns is formed by means of electrolytic hole filling; and/or, each of the several second heat conduction columns is formed by means of hole filling.

In some embodiments, the first groove includes: a first groove body, configured to accommodate the chip; and a second groove body, in communication with the first groove body, disposed on a side of the first groove body away from the digital core board layer, and configured to accommodate a cable electrically connected to the chip and the microwave core board layer.

In some embodiments, a radial size of the second groove body is greater than that of the first groove body.

In some embodiments, the microwave core board layer includes a plurality of first sub core board layers arranged in a stacking manner, a first guiding through hole is defined on the microwave core board layer along a stacking direction thereof, so as to communicate with at least two layers of the first sub core board layers; and/or, the digital core board layer includes a plurality of second sub core board layers arranged in a stacking manner, a second guiding through hole is defined on the digital core board layer along a stacking direction thereof, so as to communicate with at least two layers of the second sub core board layers.

In some embodiments, the printed circuit board further defines a third guiding through hole, and the third guiding through hole penetrates the microwave core board layer and the digital core board layer; and the first guiding through hole, the second guiding through hole, and the third guiding through hole are configured to serve as the interlayer connecting path.

In some embodiments, at least one of the first guiding through hole, the second guiding through hole, and the third guiding through hole is a metal hole.

According to a second aspect of the embodiments of the present disclosure, a transceiver assembly is provided. The transceiver assembly is configured to be connected to one or more antenna units and includes: a printed circuit board for a phased array antenna transceiver assembly, including: a microwave c ore board layer, operating in a first frequency band, where a chip carrying area is arranged on a side of the microwave core board layer, and the chip carrying area is configured to carry a chip; a digital core board layer, operating in a second frequency band and stacked on another side of the microwave core board layer away from the chip carrying area; where an interlayer connecting path is arranged on the microwave core board layer and the digital core board layer, and the interlayer connecting path is connected to the chip carrying area; and a heat dissipation member, embedded in the digital core board layer and connected to the chip carrying area; and at least one chip, disposed on the chip carrying area and corresponding to the chip carrying area in a one-to-one manner; where the interlayer connecting path is configured to connect the chip disposed on the chip carrying area.

In some embodiments, the microwave core board layer includes a plurality of chip carrying areas, each of the plurality of chip carrying areas correspondingly carries one of the at least one chip, and the transceiver assembly has a plurality of at least one signal channel.

According to a third aspect of the embodiments of the present disclosure, a radar is provided. The radar includes: several antenna units, configured to transmit and receive signals; and a transceiver assembly, connected to the several antenna units, and configured to receive or output the signals. The transceiver assembly includes: a printed circuit board for a phased array antenna transceiver assembly, including: a microwave core board layer, operating in a first frequency band, where a chip carrying area is arranged on a side of the microwave core board layer, and the chip carrying area is configured to carry a chip; a digital core board layer, operating in a second frequency band and stacked on another side of the microwave core board layer away from the chip carrying area; where an interlayer connecting path is arranged on the microwave core board layer and the digital core board layer, and the interlayer connecting path is connected to the chip carrying area; and a heat dissipation member, embedded in the digital core board layer and connected to the chip carrying area; and at least one chip, disposed on the chip carrying area and corresponding to the chip carrying area in a one-to-one manner; where the interlayer connecting path is configured to connect the chip disposed on the chip carrying area.

The above are only embodiments of the present disclosure and are not intended to limit the scope of the present disclosure. Any equivalent structure or process transformation using the contents of the specification and the accompanying drawings of the present disclosure, or any direct or indirect application in other related technical fields, is equally included in the scope of the present disclosure.

What is claimed is:

1. A printed circuit board for a phased array antenna transceiver assembly, comprising:
   a microwave core board layer, operating in a first frequency band, wherein a chip carrying area is arranged on a side of the microwave core board layer, and the chip carrying area is configured to carry a chip;
   a digital core board layer, operating in a second frequency band and stacked on another side of the microwave core board layer away from the chip carrying area; wherein an interlayer connecting path is arranged on the microwave core board layer and the digital core board layer, and the interlayer connecting path is connected to the chip carrying area; and
   a heat dissipation member, embedded in the digital core board layer and connected to the chip carrying area.

2. The printed circuit board according to claim 1, wherein a first groove is defined on the side of the microwave core board layer, and the first groove is configured to serve as the chip carrying area.

3. The printed circuit board according to claim 2, wherein a second groove is defined on a side of the digital core board layer opposite to the microwave core board layer and corresponds to a position where the first groove is defined, and the heat dissipation member is disposed in the second groove.

4. The printed circuit board according to claim 3, wherein a side surface of the heat dissipation member opposite to the microwave core board layer is flush with a side surface of the digital core board layer away from the microwave core board layer.

5. The printed circuit board according to claim 3, wherein several first thermally conductive columns are arranged on a side of the microwave core board layer facing the digital core board layer, and several second thermal conductive columns are arranged on a side of the digital core board layer facing the microwave core board layer; and
   the several first thermally conductive columns and the several second thermally conductive columns are arranged in one-to-one correspondence, and heat of the chip is transferred to the heat dissipation member through the several first thermally conductive columns and the several second thermally conductive columns.

6. The printed circuit board according to claim 5, wherein several first thermal conductive holes are defined on the side of the microwave core board layer facing the digital core board layer, and a metal medium is arranged in each of the several first thermal conductive holes to form each of the several first thermal conductive columns; and several second thermal conductive holes are defined on the side of the digital core board layer facing the microwave core board layer, and a metal medium is arranged in each of the several second thermal conductive holes to form in each of the several second thermal conductive columns.

7. The printed circuit board according to claim 6, wherein the microwave core board layer has a first side and a second side, the chip carrying area is arranged on the first side of the microwave core board layer, and the digital core board layer is stacked on the second side of the microwave core board layer.

8. The printed circuit board according to claim 7, wherein the several first thermal conductive holes extend along a direction of the second side of the microwave core layer facing the first side.

9. The printed circuit board according to claim 7, wherein a radial size of the first thermal conductive column gradually decreases along the direction of the second side of the microwave core layer facing the first side of the microwave core layer.

10. The printed circuit board according to claim 7, wherein the several first thermal conductive columns extend along a direction of the second side of the microwave core layer facing the first side of the microwave core layer, and correspond to a bottom wall of the first groove.

11. The printed circuit board according to claim 6, wherein the several second thermal conductive holes extend along a direction from a side of the digital core layer facing the microwave core layer to a side of the digital core layer away from the microwave core layer.

12. The printed circuit board according to claim 5, wherein each of the several first thermal conductive columns is formed by means of electrolytic hole filling;

and/or, each of the several second heat conduction columns is formed by means of hole filling.

13. The printed circuit board according to claim 2, wherein the first groove comprises:

a first groove body, configured to accommodate the chip; and a second groove body, in communication with the first groove body, disposed on a side of the first groove body away from the digital core board layer, and configured to accommodate a cable electrically connected to the chip and the microwave core board layer.

14. The printed circuit board according to claim 13, wherein a radial size of the second groove body is greater than that of the first groove body.

15. The printed circuit board according to claim 1, wherein the microwave core board layer comprises a plurality of first sub core board layers arranged in a stacking manner, a first guiding through hole is defined on the microwave core board layer along a stacking direction thereof, so as to communicate with at least two layers of the first sub core board layers;

and/or, the digital core board layer comprises a plurality of second sub core board layers arranged in a stacking manner, a second guiding through hole is defined on the digital core board layer along a stacking direction thereof, so as to communicate with at least two layers of the second sub core board layers.

16. The printed circuit board according to claim 15, wherein the printed circuit board further defines a third guiding through hole, and the third guiding through hole penetrates the microwave core board layer and the digital core board layer; and the first guiding through hole, the second guiding through hole, and the third guiding through hole are configured to serve as the interlayer connecting path.

17. The printed circuit board according to claim 16, wherein at least one of the first guiding through hole, the second guiding through hole, and the third guiding through hole is a metal hole.

18. A transceiver assembly, configured to be connected to one or more antenna units and comprising:

a printed circuit board for a phased array antenna transceiver assembly, comprising:

a microwave c ore board layer, operating in a first frequency band, wherein a chip carrying area is arranged on a side of the microwave core board layer, and the chip carrying area is configured to carry a chip;

a digital core board layer, operating in a second frequency band and stacked on another side of the microwave core board layer away from the chip carrying area; wherein an interlayer connecting path is arranged on the microwave core board layer and the digital core board layer, and the interlayer connecting path is connected to the chip carrying area; and a heat dissipation member, embedded in the digital core board layer and connected to the chip carrying area; and at least one chip, disposed on the chip carrying area and corresponding to the chip carrying area in a one-to-one manner;

wherein the interlayer connecting path is configured to connect the chip disposed on the chip carrying area.

19. The transceiver assembly according to claim 18, wherein the microwave core board layer comprises a plurality of chip carrying areas, each of the plurality of chip carrying areas correspondingly carries one of the at least one chip, and the transceiver assembly has a plurality of signal channels.

20. A radar, comprising:

several antenna units, configured to transmit and receive signals; and a transceiver assembly, connected to the several antenna units, and configured to receive or output the signals;

wherein the transceiver assembly comprises:

a printed circuit board for a phased array antenna transceiver assembly, comprising:

a microwave core board layer, operating in a first frequency band, wherein a chip carrying area is arranged on a side of the microwave core board layer, and the chip carrying area is configured to carry a chip;

a digital core board layer, operating in a second frequency band and stacked on another side of the microwave core board layer away from the chip carrying area; wherein an interlayer connecting path is arranged on the microwave core board layer and the digital core board layer, and the interlayer connecting path is connected to the chip carrying area; and a heat dissipation member, embedded in the digital core board layer and connected to the chip carrying area; and at least one chip, disposed on the chip carrying area and corresponding to the chip carrying area in a one-to-one manner;

wherein the interlayer connecting path is configured to connect the chip disposed on the chip carrying area.

* * * * *